(12) United States Patent
Patti

(10) Patent No.: US 6,300,660 B1
(45) Date of Patent: Oct. 9, 2001

(54) BIPOLAR TRANSISTOR THAT CAN BE FABRICATED IN CMOS

(76) Inventor: Robert Patti, 1 S. 751 Avon Dr., Warrenville, IL (US) 60555

( * ) Notice: Subject to any disclaimer, the term of this patent is extended or adjusted under 35 U.S.C. 154(b) by 0 days.

(21) Appl. No.: 09/476,624

(22) Filed: Dec. 31, 1999

(51) Int. Cl.$^7$ .................................................. H01L 29/76
(52) U.S. Cl. .......................... 257/368; 257/364; 257/378; 257/245; 257/288
(58) Field of Search .................................... 257/368, 364, 257/245, 489, 401, 328, 369, 288

(56) References Cited

FOREIGN PATENT DOCUMENTS

358039064 * 3/1983 (JP) .

* cited by examiner

Primary Examiner—Steven Loke
Assistant Examiner—Donghee Kang
(74) Attorney, Agent, or Firm—Calvin B. Ward

(57) ABSTRACT

A variable conductance device having a first source region and a first drain region in a semiconductor substrate. A first channel region connects the first source and the first drain regions. A first resistive layer overlies the first channel region and has first and second electrical contacts spaced apart from one another thereon. The conductance of the path between the first source region and the first drain region depends on the current flowing between the first and second electrical contacts. By adding a FET having its gate and source shorted together to the variable conductance device, a device having the current gain characteristics of a bipolar transistor is obtained. The first drain region is connected to the drain of the FET and the source of the FET is connected to the second electrical contact. The precise form of the current transfer function can be altered by connecting a number of variable conductance devices according to the present invention in parallel.

2 Claims, 2 Drawing Sheets

BIPOLAR TRANSISTOR THAT CAN BE FABRICATED IN CMOS

FIELD OF THE INVENTION

The present invention relates to semiconductors, and more particularly, to a CMOS FET that can mimic a bipolar junction transistor.

BACKGROUND OF THE INVENTION

It would be advantageous to be able to provide a device that amplifies a current in response to a control current in some CMOS devices. For example, current-mode sense amplifiers for use in reading-out memory cells have faster read times than voltage-based devices. Unfortunately, conventional CMOS fabrication techniques are not well-adapted for fabricating current-to-current gain devices such as bipolar junction transistors. Normal CMOS processing does not provide full junction isolation of the type needed to construct bipolar junction transistors. Hence, to construct such transistors in CMOS, 3 to 5 additional masking steps and additional implant/diffusion steps are required. This increases the cost of the devices and requires larger die sizes.

Broadly, it is the object of the present invention to provide an improved CMOS transistor design.

It is a further object of the present invention to provide a CMOS device that controls a current in response to another current.

It is yet another object of the present invention to provide a CMOS device that mimics the behavior of a bipolar junction transistor.

These and other objects of the present invention will become apparent to those skilled in the art from the following detailed description of the invention and the accompanying drawings.

SUMMARY OF THE INVENTION

The present invention is a variable conductance device having a first source region and a first drain region in a semiconductor substrate. A first channel region connects the first source and the first drain regions. A first resistive layer overlies the first channel region and has first and second electrical contacts spaced apart from one another thereon. The conductance of the path between the first source region and the first drain region depends on the current flowing between the first and second electrical contacts. By adding a FET having its gate and source shorted together to the variable conductance device, a device having the current gain characteristics of a bipolar transistor is obtained. The first drain region is connected to the drain of the FET and the source of the FET is connected to the second electrical contact. The precise form of the current transfer function can be altered by connecting a number of variable conductance devices according to the present invention in parallel.

DETAILED DESCRIPTION INVENTION

Figure 1:
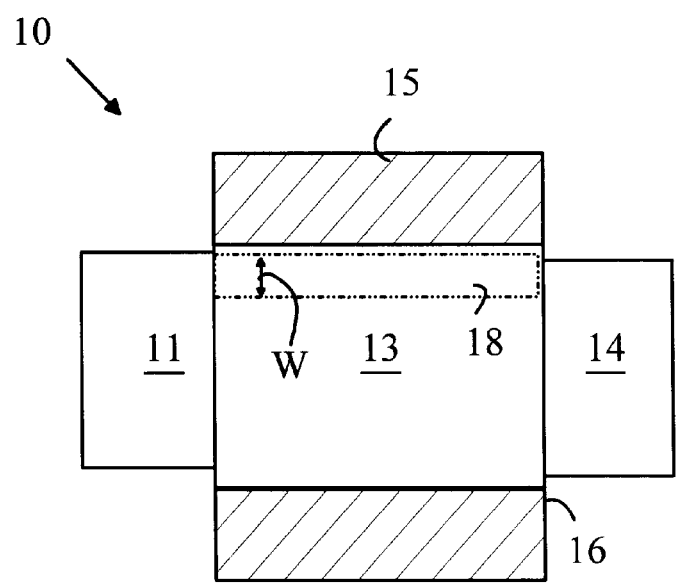
FIG. 1 is a top view of a variable conductance device 10 according to the present invention.

The present invention will be discussed first in terms of a variable conductance device. The manner in which such a device is converted to a device that mimics a bipolar junction transistor will then be explained. A variable conductance device according to the present invention is a four terminal device in which the conductance between the first and second terminals is a function of the current flowing between the third and fourth terminals. Refer now to FIG. 1 which is a top view of a variable conductance device 10 according to the present invention. Variable conductance device 10 may be viewed as a conventional field-effect transistor (FET) in which the gate has two terminals, 15 and 16, through which a control current flows. The resistivity of the polysilicon layer used to construct the gate is set to provide the desired current range. The conductance of the path between the source 11 and drain 14 is determined by the magnitude of the control current flowing between terminals 15 and 16.

Variable conductance device 10 provides a conductance that varies with the current flowing through the gate region as can be seen from the following argument. Denote the gate potential at which the channel connecting source 11 and drain 14 conducts by $V_t$, and assume that terminals 15 and 16 are connected to V and ground, respectively. The voltage will vary linearly across gate 13 as a function of the distance from terminal 15. If $V<V_t$, the channel will not conduct. As V is increased above $V_t$, there will be a region 18 adjacent to electrode 15 in which the potential is greater than $V_t$. The portion of the channel underlying this region will form a conducting path between source 11 and drain 14. The conductance of this path is, ideally, proportioned to $(V-V_t)$. The conductance of this path will increase as the width, W, of the region increases. The width, in turn, is a function of V. Hence, if the source and drain are connected to fixed voltages, the current that flows between the current and drain is a function of the current flowing between terminals 15 and 16.

Figure 2:
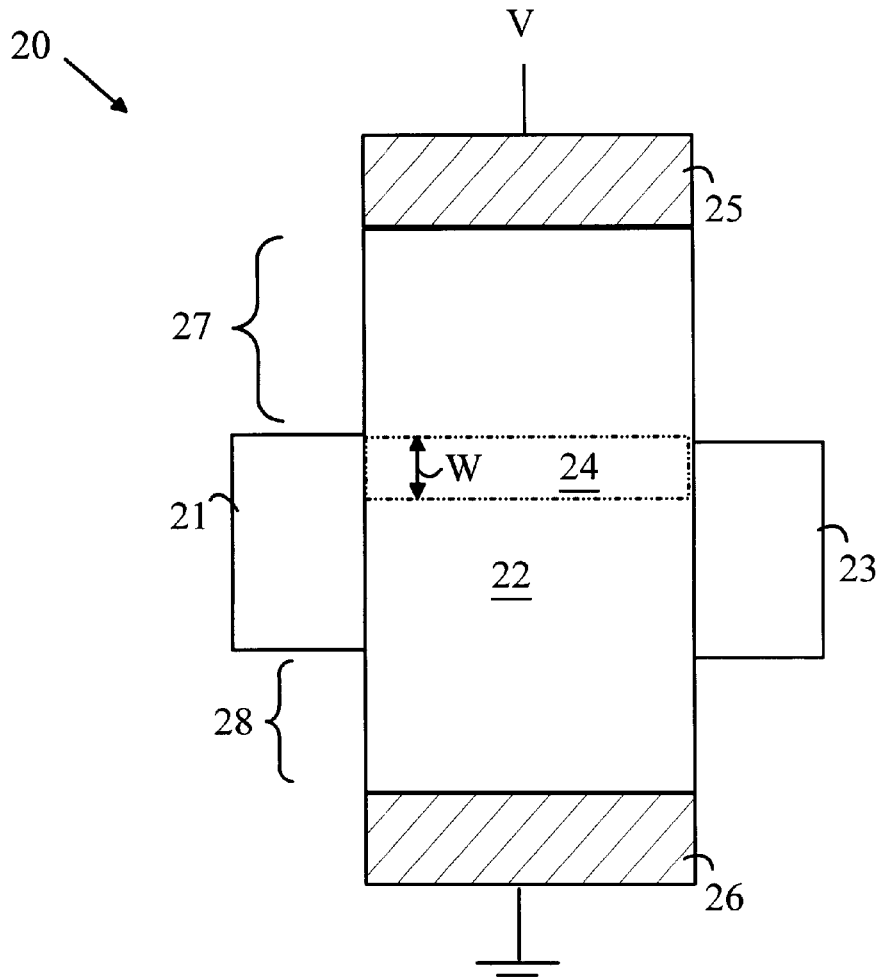
FIG. 2 is a variable conductance device 20 having resistors for controlling the functional relationship between the conductance and the current.

The precise functional relationship between the conductance and the current can be altered by combining a number of variable conductance devices in parallel. The current value at which an individual variable conductance device begins to conduct fully can be controlled by providing a resistor between the current source and the gate or between the gate and ground, respectively. A variable conductance device 20 having resistors for controlling these functions is shown in FIG. 2. Variable conductance device 20 may be viewed as a variable conductance device with a gate region 22 that extends beyond the channel region defined by source 21 and drain 23. The region 27 between the input terminal 25 and the portion of the gate that overlies the channel forms a first resistor. The region 28 between the portion of the gate that overlies the channel and the output terminal 26 forms a second resistor. The voltage on the input terminal must now be sufficient to overcome the voltage drop over region 27 and still provide a potential of Vt before the device will begin to conduct. Similarly, the second resistor, together with the portion of the gate that overlies the channel and the first resistor, determines the voltage on input terminal 25 at which the potential at the bottom edge of the gate region will be greater than $V_t$. At this potential, the width, W, of conducting region 24 will be equal to the width of the channel.

It can be shown that the conductance of the path between electrodes 21 and 23 will be a linear function of V if the resistance of region 27 is zero and the resistance of region 28 is equal to the resistance of the gate over this channel. This result assumes that the underlying FET behaves in an ideal manner. By connecting a number of variable conductance devices in parallel with different first and second resistors, any positive definite current to conductance function can be approximated.

It should be noted that the structure shown in FIG. 2 can be fabricated in processes having "buried diffusion" regions. In such processes, the width of the gate region may be set independent of the width of the channel. In conventional CMOS processes in which the gate width is determined by the channel width, separate polysilicon regions may be deposited to provide the first and second resistors.

Figure 3:
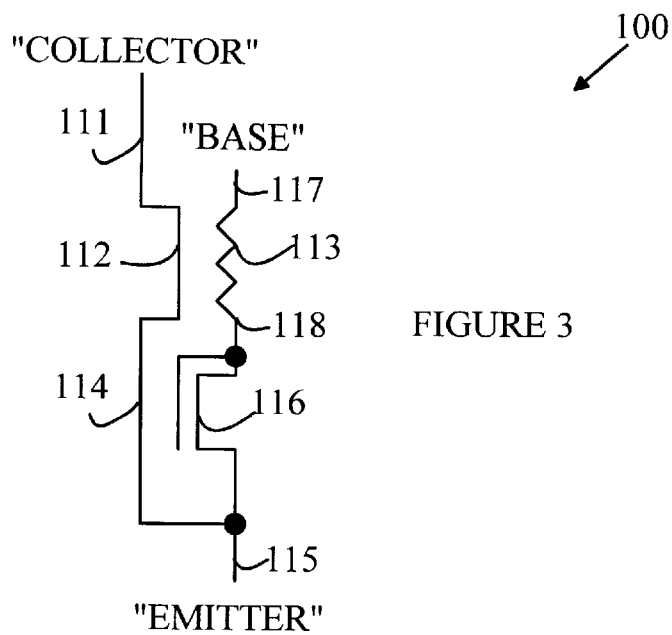
FIG. 3 is a schematic drawing of a bi-FET 100 according to the present invention.
Figure 4:
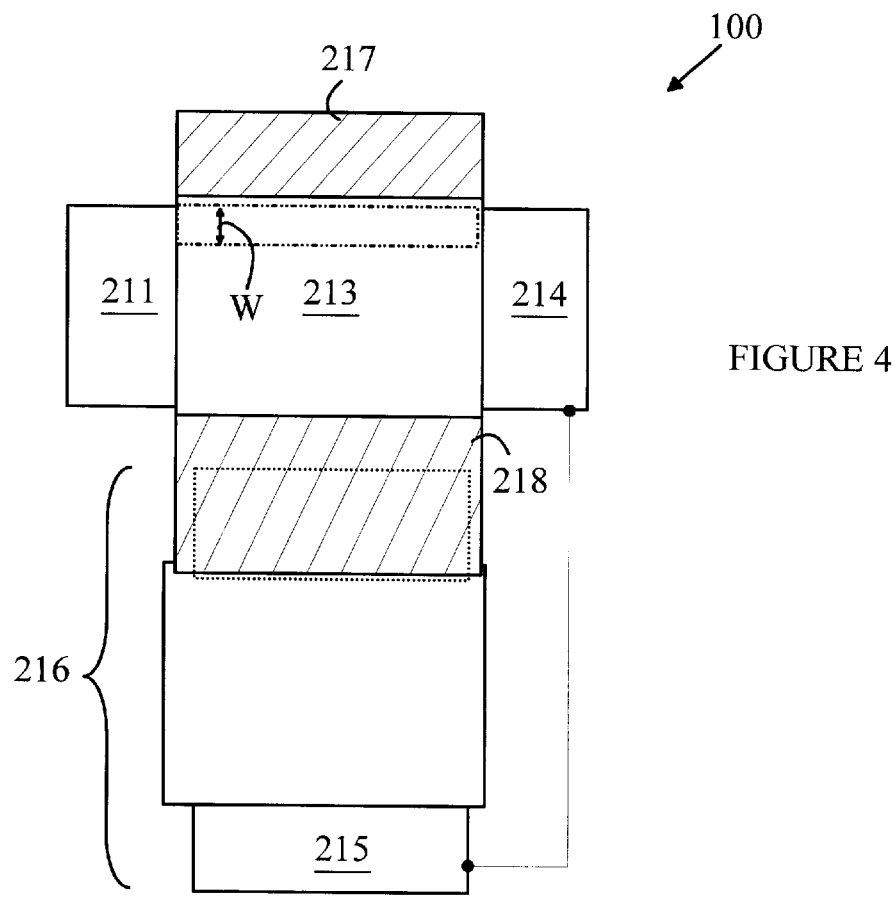
FIG. 4 is a top view of an implementation of bi-FET 100 on a silicon substrate using conventional CMOS fabrication techniques.

The manner in which the variable conductance device described above is used to construct a bi-FET 100 can be more easily understood with reference to FIGS. 3 and 4. FIG. 3 is a schematic drawing of a bi-FET 100 according to the present invention. FIG. 4 is a top view of an implementation of bi-FET 100 on a silicon substrate using conventional CMOS fabrication techniques. Bi-FET 100 is constructed from two FETs as shown at 112 and 116. FET 112 is a variable conductance device as in the devices described above. Variable conductance device 112 has four terminals including source 111 and drain 114. The other two terminals, which are shown at 117 and 118, are connected to opposite edges of gate 113. The gate 113 of FET 112 is constructed from a polysilicon layer that has a resistivity that is chosen such that the resistance of gate 113 is large compared to the channel resistance of FET 116 when FET 116 is fully conducting.

Variable conductance device 112 operates in a manner analogous to that described above with reference to variable conductance device 10 shown in FIG. 1. To simplify the following discussion, features in FIG. 4 that serve the same function as features shown in FIG. 2 have been given numeric designations that differ by 100 from the designations used in FIG. 3.

FET 116 is connected as a diode, and hence, duplicates the diode junction in the conventional bipolar FET. To simplify FIG. 4, the connection between drain 214 of FET 112 and drain 215 of FET 116 is shown as a line connecting the two regions. Hence, the current from collector to emitter will vary with the potential applied to base 117 less the diode drop across FET 116.

As noted above, the specific current amplification function can be modified by replacing variable conductance device 112 with a plurality of variable conductance devices connected in parallel. Hence, a bi-FET according to the present invention may also be used to construct an arbitrary current mapping function.

Various modifications to the present invention will become apparent to those skilled in the art from the foregoing description and accompanying drawings. Accordingly, the present invention is to be limited solely by the scope of the following claims.

What is claimed is:

1. A variable conductance device comprising a first source region and a first drain region in a semiconductor substrate, a first channel region connecting said first source and said first drain regions;

a first resistive layer overlaying said first channel region, said first resistive layer having first and second electrical contacts spaced apart from one another thereon; and a field effect transistor (FET) having a source, drain, and gate, said gate being connected to said source and said second electrical contact, and said first drain region being connected to said drain of said FET.

2. A variable conductance device comprising a first source region and a first drain region in a semiconductor substrate, a first channel region connecting said first source and said first drain regions;

a first resistive layer overlaying said first channel region, said first resistive layer having first and second electrical contacts spaced apart from one another thereon;

a second source region and a second drain region in said semiconductor substrate, said second source region being connected to said first source region, and said second drain region being connected to said first drain region;

a second channel region connecting said second source and said second drain regions; and a second resistive layer overlaying said second channel region, said second resistive layer having first and second electrical contacts spaced apart from one another thereon.

* * * * *